United States Patent [19]
Curran

[11] Patent Number: 5,126,284
[45] Date of Patent: Jun. 30, 1992

[54] METHOD OF INDUCTIVELY CONTACTING SEMICONDUCTOR REGIONS

[76] Inventor: Patrick A. Curran, Seven Lakes, Box 2112, West End, N.C. 27376

[21] Appl. No.: 782,825

[22] Filed: Oct. 25, 1991

[51] Int. Cl.⁵ ........................................... H01L 21/44
[52] U.S. Cl. ................................... 437/190; 437/242
[58] Field of Search ............... 437/190, 200, 191, 192; 252/576; 204/192.3

[56] References Cited

U.S. PATENT DOCUMENTS

| | | | |
|---|---|---|---|
| 3,813,252 | 5/1974 | Lipp et al. | 252/520 |
| 4,361,599 | 11/1982 | Wourms | 437/190 |
| 4,419,161 | 12/1983 | Hailey | 501/57 |
| 4,931,238 | 6/1990 | Nishimo et al. | 264/62 |

FOREIGN PATENT DOCUMENTS

| | | | |
|---|---|---|---|
| 62-274624 | 11/1987 | Japan | 437/190 |
| 1-206622 | 8/1989 | Japan | 437/190 |
| 63-245568 | 3/1990 | Japan . | |

Primary Examiner—Olik Chaudhuri
Assistant Examiner—Loc Q. Trinh
Attorney, Agent, or Firm—John G. Mills

[57] ABSTRACT

A semiconductor contact system is formed by inductively coupling an ohmic electrode, such as a metal, to a semiconductor region by means of an intervening diamagnetic boride glass, which necessarily constrains most electric current to prevail along the uniaxial normal to the semiconductor contact. The low permeability of the diamagnetic boride glass results in a low resistance to direct-current electricity along the uniaxial displacement axis of the diamagnetic boride glass. The transient time constant associated with the inductor is generally much smaller than the semiconductor device switching times, with the steady-state current being essentially established by the semiconductor resistance so as to result in an ohmic semiconductor contact void any significant rectification effects. An ohmic contact by means of an inductively-coupled electrode is generally independent of the semiconductor conductivity or ionicity.

5 Claims, 1 Drawing Sheet

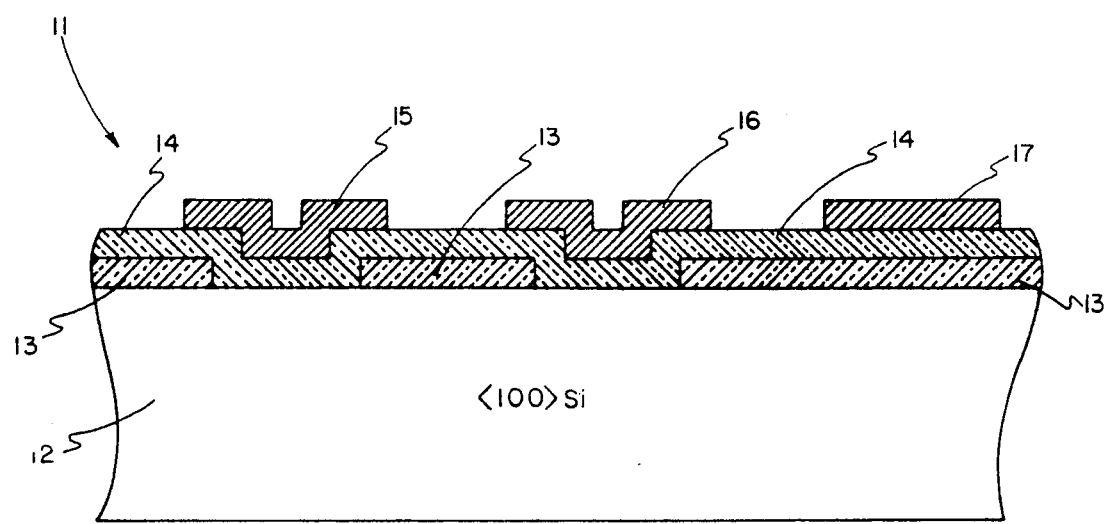
FIGURE

METHOD OF INDUCTIVELY CONTACTING SEMICONDUCTOR REGIONS

BACKGROUND OF THE INVENTION

1. Field of the Invention

This invention relates to the means for and methods of electrically contacting monocrystalline semiconductors and, more particularly, to a semiconductor contact system comprised of an ohmic electrode inductively contacting a monocrystalline semiconductor region by means of an intervening diamagnetic boride glass.

2. Description of the Relevant Art

Most solid-state electronic devices require an electrical contact to monocrystalline semiconductor regions by means of ohmic electrodes. Ohmic electrodes are electrically conductive materials exhibiting a time-independent correspondence between current and voltage in accordance with Ohm's law so as to be capable of impressing electrical bias conditions upon circuit elements. Ohmic electrodes are most often metals but may be formed by other suitable materials such as a silicide or a doped semiconductor. An ohmic material such as a metal necessarily forms a rectifying junction when in intimate electrical contact with an intrinsic monocrystalline semiconductor. Furthermore, said metal/semiconductor rectifying junction is of limited utility in electronic devices, owing to the existence of a large concentration of strain-induced interface states.

Thus, the electrical contact of a monocrystalline semiconductor region generally requires the suppression of contact rectification in some manner. Historically, contact rectification is suppressed by the impurity doping of the monocrystalline semiconductor region. However, said impurity doping alters the physical properties of an intrinsic monocrystalline semiconductor, and thus, restricts the allowable types of active circuit elements. Moreover, many types of semiconductors, most notably wide-bandgap II-VI compound semiconductors, are insusceptible to the suppression of contact rectification by means of amphoteric doping, i.e. by both acceptor doping and donor doping.

It is heretofore generally impractical to electrically contact an intrinsic monocrystalline semiconductor region in a manner void of contact rectification effects. The impurity doping of the monocrystalline semiconductor region can indeed reduce contact rectification effects in limited types of monocrystalline semiconductors, most notably in the elemental semiconductors in a diamond lattice configuration. However, the suppression of contact rectification by means of the impurity doping of the monocrystalline semiconductor region necessarily limits the range and performance of the active circuit elements suitable for monolithic integration.

SUMMARY OF THE INVENTION

A general object of the invention is to provide an ohmic contact to a semiconductor region by means of an inductively coupled electrode in a manner independent of the semiconductor conductivity under steady-state conditions.

Another general object of the invention is to provide the means to suppress contact rectification effects between an ohmic electrode and a semiconductor region in a manner independent of the semiconductor conductivity.

A yet further object of the invention is to provide an ohmic contact to a semiconductor in a manner independent of the semiconductor ionicity so as to provide a general means of contacting elemental and compound semiconductors.

In accordance with a broad aspect of the invention, a semiconductor contact system is formed by a diamagnetic glass intervening between an ohmic electrode, which is typically a metal, and semiconductor region in a manner inductively coupling the ohmic electrode and the semiconductor. A diamagnetic glass is suitably formed by certain borides of the Group-IV elements, e.g. carbon diboride, silicon diboride, and germanium diboride, with the property that most electromagnetic displacements in said diamagnetic glasses are materially constrained to one spatial degree of freedom with virtually no electromagnetic displacement prevailing in the plane of the semiconductor contact. The low permeability of the diamagnetic glass renders the inductive transient response time generally insignificant relative to the normal device switching times such that ohmic semiconductor contact is thereby formed.

BRIEF DESCRIPTION OF THE DRAWING

The invention is illustrated in the accompanying drawing, in which:

FIGURE is a side elevational cross-section of a semiconductor material on which a patterned silicon dioxide film is overlayed with an unpatterned silicon diboride film so as to provide an inductive semiconductor contact in the oxide via's where the boride film is overlayed with an electrode in accordance with an embodiment of the invention.

DETAILED DESCRIPTION OF THE PREFERRED EMBODIMENTS

Solid-state electronic devices involve some sort of arrangement of active circuit elements formed in monocrystalline semiconductor regions that are necessarily terminated in some manner by passive circuit elements. Whereas active circuit elements provide the inherent capability for change-of-state transformations, the passive circuit elements provide the means to impress a desired set of current-voltage conditions upon the active circuit elements, since ideal passive circuit elements are not susceptible to change-of-state transformations. Solid-state electronic devices best operate under the conditions of some sort of integration of active and passive circuit elements.

There exist three general types of passive circuit elements: resistor, capacitor, and inductor. Each such passive element is fundamentally different and, accordingly, exhibits very different current-voltage characteristics. An ideal resistor exhibits a time-independent correspondence between current and voltage in accordance with Ohm's law. An ideal capacitor exhibits an electrical impedance inversely proportional to frequency while conversely an ideal inductor exhibits an electrical impedance directly proportional to frequency. Due to the time-dependence of the current-voltage characteristics, capacitors and inductors can both store finite amounts of energy, albeit in differing manners. Each type of passive circuit element performs a fundamentally different function in the termination of a monocrystalline semiconductor region hosting active circuit elements, as will be more fully developed herein.

A resistive material generally subject to Ohm's law, which includes metals, forms a rectifying junction in intimate contact with a monocrystalline semiconductor region. However, most such rectifying junctions are of limited utility in electronic devices due to a generally high concentration of strain-induced interface states. A much preferred means of establishing a rectifying junction is by means of juxtapositioned monocrystalline semiconductor regions of a differing impurity concentration, which results in adjoined material regions of a common monocrystalline periodicity but with a differing electrochemical potential, so as to thus induce a variation in the Fermi level in a space charge region about the metallurgical junction in a manner generally void of deleterious strain-induced interface states. Resistors can be also formed in bulk monocrystalline semiconductor regions by means of donor or acceptor doping, with the resistance being a function of net impurity doping concentration.

A capacitive dielectric material, such as silicon dioxide, forms a nonrectifying junction with a low recombination velocity when in intimate contact with a suitable monocrystalline semiconductor region, such as silicon. An ohmic electrode capacitively coupled to a monocrystalline semiconductor region by means of a suitable dielectric is generally employed to considerable advantage in most microelectronic integrated circuits and is more specifically exploited in sundry field-effect transistors. Under low frequency conditions, the Fermi level in the monocrystalline semiconductor surface will vary in response to a capacitively-impressed voltage induced by an overlaying ohmic electrode that is generally subject to external control. The ability of the semiconductor Fermi level to so vary in response to an impressed excitation directly results from the ability of a monocrystalline semiconductor to be readily susceptible to change-of-state transformations, which is a fundamental property of an active circuit element formed in a monocrystalline semiconductor.

Basically, a parallel-plate capacitor is formed with a suitable dielectric (such as silicon dioxide), an overlaying ohmic electrode (such as aluminum), and an underlaying semiconductive electrode (such as monocrystalline silicon). The capacitance of a metal/dielectric/semiconductor capacitor is thus necessarily comprised of a field-independent capacitive component due to the passive dielectric that is insusceptible to change-of-state transformation and also a field-dependent capacitive component due to the active monocrystalline semiconductor surface that is susceptible to change-of-state transformation. Both such capacitive components are necessarily in series between the ohmic electrode and the bulk monocrystalline semiconductor region.

The net capacitance of two series capacitive components is generally governed by the component with the smallest capacitance, when there prevails a large disparity between both such capacitances. As the dielectric capacitance is inversely proportional to the dielectric thickness in a field-independent manner, then for a sufficiently thick dielectric the net capacitance can be substantially reduced and, furthermore, can be governed by the dielectric material in a field-independent manner. Said condition can be practically accomplished in many solid-state electronic devices, particularly those employing monocrystalline silicon with an overlaying dielectric formed by silicon dioxide. The material preparation of silicon/silicon dioxide systems is well appreciated by those skilled in the art of solid-state electronics.

The foregoing method of capacitively impressing a voltage upon a monocrystalline semiconductor surface by means of an ohmic electrode and a dielectric under the conditions of a low net capacitance (due to a sufficiently thick dielectric) is precisely the means employed in microelectronic integrated circuits to selectively isolate ohmic electrodes from the underlaying monocrystalline semiconductor surface. A suitably prepared silicon/silicon dioxide interface results in a nonrectifying junction with a low recombination velocity, so as to not generally effect electronic displacements elsewhere within the bulk monocrystalline region. For a thick silicon dioxide, generally termed a field oxide, then variations in the Fermi level of the monocrystalline semiconductor surface in response to a variation in an overlaying ohmic electrode will be minimal due to the substantially reduced capacitance.

Owing to the high impedance of a capacitor formed by a dielectric with a large shunt resistance, then virtually no electric charge will be displaced between the ohmic electrode and the bulk monocrystalline semiconductor region, at least for sufficiently low frequencies. Thus, metal electrodes can be selectively patterned over field oxide regions, e.g. regions of thick (greater than one micron) silicon dioxide, in order to selectively interconnect various active circuit elements with varying voltages in a manner not substantially affecting the monocrystalline semiconductor regions underlaying the field oxide. The ability to electrically isolate metallic electrodes from an underlaying monocrystalline silicon semiconductor region by means of an intervening silicon oxide film of sufficient thickness has been well appreciated since the invention of the semiconductor device-and-lead structure by Robert Noyce in 1959 in U.S. Pat. No. 2,981,877.

Although a thick dielectric provides a most satisfactory means to electrically isolate ohmic electrodes from monocrystalline semiconductor regions, nonetheless, it is necessary in electronic devices to impress voltages and currents upon active circuit elements formed within the bulk monocrystalline semiconductor regions. Such can be accomplished by first selectively patterning and etching the field oxide in regions where a semiconductor contact is desired. A dielectric glass, such as silicon dioxide, can be readily patterned by known photolithographic means and can be readily etched by hydrofluoric acid, plasma etches, and other such means. In this manner, reduced oxide thickness can be selectively established without harm to the field oxide.

The foregoing semiconductor contact regions can take one of two general forms: 1.) a selective reduction in the dielectric thickness or 2.) a selective removal of the dielectric oxide in via's. Consider, initially, the former semiconductor contact system. The field oxide capacitance can be increased by a selective, controlled etch of the field oxide or, more often, a selective removal of the field oxide in via's and a controlled reoxidation to a desired dielectric thickness. By substantially reducing the dielectric thickness, then the contribution of the field-dependent capacitance due to the monocrystalline semiconductor surface becomes significant with respect to that of the field-independent dielectric capacitance.

In this manner, voltage variations in the overlaying ohmic electrode relative to the bulk monocrystalline semiconductor region result in a voltage division across the passive and active capacitive components. Since the active capacitive component is formed in the monocrystalline semiconductive region and is, thus, subject to field-induced change-of-state transformations, then said capacitive component undergoes variation in response to a voltage variation, at least such is the case for a sufficiently low frequency. The active capacitance is varied by means of a variation in the surface charge density, which amounts to a variation in the semiconductor surface Fermi level. Such a variation in the surface charge density, of course, must correspondingly vary the electrical conductivity of the monocrystalline semiconductor surface.

The ability to exhibit a variation in electrical conductivity over many orders of magnitude is a prominent feature of monocrystalline semiconductors, most particularly elemental semiconductors in a diamond lattice configuration. Thus, a capacitively-impressed voltage variation between an ohmic electrode and a bulk monocrystalline semiconductor region by means of a high capacitance has the effect of modulating the surface Fermi level of the semiconductor in response to said voltage variation, with a corresponding variation in the electrical conductivity of the monocrystalline semiconductor surface region near the dielectric/semiconductor interface.

A field-effect transistor exploits the ability to modulate the electrical conductivity of a monocrystalline semiconductor region by means of a capacitively-impressed voltage via a high-capacitance dielectric. Source and drain regions are electrically connected by a monocrystalline semiconductor surface region underlaying a high-capacitance dielectric which, in turn, is overlayed by an ohmic electrode. The ohmic electrode is biased relative to the bulk monocrystalline semiconductor region in one state so as to result in a low semiconductor surface conductivity under the gate dielectric and in another state so as to result in a high semiconductor surface conductivity under the gate dielectric. In this manner, the series resistance between the source and drain regions can be either in a high impedance state or in a low impedance state, dependent upon the electrical bias of the ohmic electrode relative to the bulk semiconductor.

In summary, it can be appreciated that a voltage can be capacitively impressed upon a monocrystalline semiconductor region by means of a dielectric glass so as to induce a variation in the Fermi level of the semiconductor surface dependent upon the dielectric capacitance. In such a parallel-plate capacitor, the capacitance can be thus controlled by the dielectric thickness. For a small dielectric capacitance, the semiconductor Fermi level is not significantly modulated by variations in the overlaying ohmic electrode; while conversely, for a large dielectric capacitance, the semiconductor Fermi level can be significantly modulated by the overlaying ohmic electrode. In both cases, there can prevail very little direct-current electrical displacement through the dielectric. The impedance to an electric current always remains high for low frequency oscillations. In this manner, a thick dielectric, e.g. a silicon dioxide film over one micron thick, provides an excellent means to isolate ohmic electrodes from monocrystalline semiconductor regions at low frequency.

There, however, prevails a general need in most solid-state electronic devices, including field-effect transistors, to electrically contact monocrystalline semiconductor regions in a manner not generally perturbing the semiconductor Fermi level. In this manner, it is desirable that bulk monocrystalline semiconductor regions can be electrically biased at some voltage potential and that electric currents can prevail in said regions in direct correspondence to an electromotive force without significant rectification effects. Such an electrical contact is generally impractical by means of a capacitor due to the very nature of a capacitor, and thus, the dielectric glass is totally removed to expose the electrical contact regions of active circuit elements within a monocrystalline region.

The only other types of passive elements, of course, are inductors and resistors, where a resistor is taken to be any material obeying Ohm's law, e.g. a metal. Inductors are generally wire-wound passive elements not suitable for monolithic integration with active circuit elements. As a result, ohmic electrodes, and most particularly metals, have been historically utilized to electrically contact a monocrystalline semiconductor region. However, an ohmic electrode introduces a contact rectification with an intrinsic monocrystalline semiconductor. In most solid-state electronic devices, contact rectification is generally undesirable and must be suppressed in some manner.

Prior to the present invention the most common means of suppressing contact rectification resulting from a metallic electrode has been by means of the impurity doping of the monocrystalline semiconductor region. Two fundamental problems are associated with such an approach. First of all, the impurity doping concentration required to suppress contact rectification generally is sufficiently high to induce the onset of degeneracy. In many active circuit elements, it is often desirable to utilize doped monocrystalline semiconductor regions of a much lower dopant concentration.

Historically, such has been accomplished by selectively doping the monocrystalline semiconductor region near the metal/semiconductor interface with the same dopant type but at a higher doping concentration than the interior bulk semiconductor region to which a bias contact is desired. However, a rectifying isotype homojunction is formed at the interface between the dissimilarly doped monocrystalline semiconductor regions, such that a conductivity modulation of the lower-doped region by the higher-doped region will necessarily prevail under forward-bias conditions. It is inescapable that the suppression of contact rectification by way of impurity doping necessarily affects the operation of active circuit elements formed in the bulk semiconductor.

A second, and more restrictive, problem is the general need to amphoterically dope monocrystalline semiconductor regions in solid-state devices requiring a rectifying junction suitable for the generation of excess electron-hole pairs. The most practical means of producing a rectifying junction void of deleterious strain-induced interface states is by means of an anisotype p-n homojunction formed by the donor doping and acceptor doping of contiguous monocrystalline semiconductor regions of the same crystalline material. Such anisotype p-n homojunctions are the most common type of rectifying junction utilized in microelectronic integrated circuits. The need to suppress contact rectification requires a high donor concentration of the n-type region and a high acceptor concentration of the p-type region near the metal/semiconductor interfaces.

Elemental semiconductors in a diamond lattice configuration, such as silicon, are highly susceptible to amphoteric doping in order to form anisotype p-n homojunctions generally void of contact rectification effects. However, compound semiconductors, and most notably the wide-bandgap II-VI compound semiconductors, exhibit a large ionicity that imbalances the density of states between the conduction and valence bands. As a result, such compound semiconductors are generally susceptible to either a high donor concentration or a high acceptor concentration, but never both. The inability to amphoterically dope wide-bandgap II-VI compound semiconductors precludes the ability to form anisotype p-n homojunctions in a manner void of contact rectification effects.

Unfortunately, the inability to generally form an anisotype p-n homojunction void of contact rectification effects in the zinc and cadmium chalcogenides greatly limits solid-state optoelectronic devices by inhibiting solid-state injection electroluminescence throughout the visible-light spectrum. The large ionicity of compound semiconductor materials such as zinc sulfide and zinc selenide results in a highly efficient radiative recombination of excess electron-hole pairs so as to emit radiation of a visible-light wavelength. However, the associated inability to generally acceptor dope such monocrystalline materials precludes the ability to efficiently induce excess electron-hole pairs by means of forward-biased rectifying junction void of contact rectification effects.

The inherent limitation in electrically contacting a monocrystalline semiconductor region is, however, fundamentally resolved by means of a parallel-plate inductor utilizing a diamagnetic glass, as more fully described in a copending U.S. patent application Ser. No. 758,841, filed Sep. 13, 1991, entitled "Parallel-Plate Inductor Formed by a Diamagnetic Glass", by Patrick A. Curran, both the inventor and assignee hereof. The diamagnetic glass is generally a boride of a Group-IV element, with silicon diboride being a highly useful diamagnetic glass in silicon-based solid-state electronic devices. A diamagnetic glass is any glass that uniaxially constrains the electric and magnetic fields along generally one spatial degree of freedom so as to thus exhibit a time-dependent electrical impedance that increases with the frequency of a temporal excitation.

A diamagnetic glass such as silicon diboride, $SiB_2$, can be processed in a manner fully compatible with solid-state electronic devices and microelectronic circuits. The pyrolysis of certain gaseous reactants can result in the epitaxial deposition of diamagnetics over a suitable electronic material substratum. One such type of pyrolysis is rapid thermal chemical vapor deposition, whereby gaseous reactants are introduced into a chamber, often evacuated to some degree, wherein the deposition substrate is thereby radiatively heated by halogen lamps or by other similar such means. Specifically, diborane, $B_2H_6$, and silane, $SiH_4$, can be introduced into the foregoing apparatus by means of a carrier gas, such as hydrogen, with vacuum pressures typically ranging between 1-10 torr.

The substrates may be optically heated between typically 500°-700° C. Under suitably adjusted reactant flow rates, a surface-reaction-limited deposition of silicon diboride can be obtained with the deposition rate being dependent upon the substrate temperature as controlled by the lamps. By way of example, a flow rate of 350 sccm of a 3.3% mixture of diborane in hydrogen and a flow rate of 6.9% mixture of silane in hydrogen at a chamber pressure of 3 torr results in the surface-reaction-limited deposition of silicon diboride at 600° C., with a deposition rate of the order of one micron per minute. The diborane and silane are pyrolyzed at the substratum surface so as to result in a solid precipitate over the radiatively-heated substrate, with gaseous hydrogen evolving as a chemical by-product per the following relationship:

$$B_2H_6 + SiH_4 \rightarrow SiB_2 \downarrow + 5H_2 \uparrow$$

Silicon diboride, like silicon dioxide, provides a nonrectifying termination of a monocrystalline semiconductor surface and results in a low recombination velocity with suitable semiconductors, such as silicon. Diamagnetics such as silicon diboride exhibit a very low resistance so as to offer virtually no impedance to direct-current electricity. However, the electrical impedance increases with frequency. An ohmic electrode can be overlayed upon a diamagnetic glass that terminates a monocrystalline semiconductor region so as to form a metal/diamagnetic/semiconductor inductor in direct analogy to a metal/dielectric/semiconductor capacitor.

Diamagnetics, such as silicon diboride, exhibit a most unique property that is highly useful in solid-state electronic devices. More specifically, diamagnetics such as silicon diboride materially constrain most electrical current along one spatial degree of freedom with no significant electrical current capable of flowing in the plane normal to said displacement axis. Such properties of a diamagnetic are more fully explained in the aforementioned copending patent application. When suitably deposited by epitaxial means, the displacement axis of such a diamagnetic boride glass is generally normal to the substratum surface. A diamagnetic boride glass can overlay an oxide-terminated monocrystalline semiconductor surface in an unpatterned manner, with the property that all significant current conduction can only prevail along a surface normal into the semiconductor regions exposed by an oxide via.

Consider the FIGURE wherein the cross-section 11 of a monocrystalline silicon region 12 terminated by a selectively patterned silicon dioxide film 13 which is overlayed by an unpatterned silicon diboride film 14. Finally, aluminum is selectively patterned to form three electrodes 15-17. The dielectric oxide glass inhibits any time-independent electric current in response to an impressed electromotive force. The diamagnetic boride glass promotes an electric current in response to an impressed electromotive force, albeit only along a normal to the silicon substrate and never generally parallel to the plane of the substrate. As a result, no significant electric current can ever exist between electrodes 15 and 17 in response to an impressed electromotive force or between electrodes 16 and 17 under similar such conditions.

However, an electric current can indeed prevail between electrodes 15 and 16 in response to an impressed electromotive force, owing to the exposed silicon region and the lack of any rectification effects at the silicon/silicon diboride interface. Much as silicon dioxide and silicon form a nonrectifying junction with a low recombination velocity, then so too do silicon diboride and silicon, albeit with a contrary type of current-voltage characteristics. A metal/dielectric/semiconductor structure capacitively impresses a voltage upon a monocrystalline semiconductor in a manner generally independent of the semiconductor conductivity under steady-state conditions; conversely, a metal/diamagnetic/semiconductor structure inductively impresses a current upon a monocrystalline semiconductor in a manner generally independent of the semiconductor conductivity under steady-state conditions.

It must be appreciated that yet other types of such diamagnetics, also characterized by materially-constrained uniaxial electrical currents giving rise to an inductive glass, can also be synthesized with similar physical properties to those exhibited by silicon diboride. By way of example, the tetravalent silicon atoms can be replaced by tetravalent carbon atoms or tetravalent germanium atoms, such that carbon diboride, $CB_2$, and germanium diboride, $GeB_2$, form inductive diamagnetics. Carbon diboride can be formed by the pyrolysis of methane, $CH_4$, and diborane, $B_2H_6$; germanium diboride, $GeB_2$, can be formed by the pyrolysis of germane, $GeH_4$, and diborane, $B_2H_6$.

The voltage, but not the current, can always instantaneously vary across an ideal inductor. As a result, an inductor is thus a suitable passive element for electrically contacting a monocrystalline semiconductor region. An inductively-impressed current upon a semiconductor by means of a diamagnetic glass can be accomplished without any significant rectification effects or any significant recombination velocity in a manner independent of the electrical conductivity of the monocrystalline semiconductor region. However, the transient response time of the current variation across the inductor depends upon the time constant established by the diamagnetic inductance and the semiconductor resistance. A very small time constant arises from an intrinsic diamagnetic, such as silicon diboride, that is characterized by a low magnetic permeability, and a nondegenerate monocrystalline semiconductor, such as silicon, that is characterized by a relatively large electrical resistivity in the range of 0.1-100 $\Omega$-cm.

As a result, the transient variation in the inductive current can be rendered insignificant relative to the frequencies generally employed in solid-state electronic devices. In steady-state, the electric current flowing from the ohmic electrode into the monocrystalline region through a diamagnetic boride glass is virtually established by the resistance of the monocrystalline semiconductor region, which is generally much greater than that of the ohmic electrode. In this manner, an ohmic contact to a monocrystalline semiconductor region can be formed by a diamagnetic boride glass intervening between an ohmic electrode and a monocrystalline semiconductor region. An ohmic contact is taken to be an electrical contact to a monocrystalline semiconductor by an ohmic electrode, such as a metal, whereby the electric current into or out of the semiconductor region is generally in direct correspondence to the electromotive force impressed between the ohmic electrode and the semiconductor per Ohm's law under steady-state conditions.

Thus, the judicious application of a metal/diamagnetic/semiconductor parallel-plate inductor utilizing a diamagnetic boride glass provides a fundamental means of inductively impressing an electric current upon a monocrystalline semiconductor region with a negligible inductor transient response for a low diamagnetic inductance. Such a situation is precisely analogous to the application of a metal/dielectric/semiconductor parallel-plate capacitor utilizing a dielectric oxide glass that provides a fundamental means of capacitively impressing an electric voltage upon a monocrystalline semiconductor region with a negligible capacitor transient response time for a high dielectric capacitance. A capacitively-impressed voltage and an inductively-impressed current upon a monocrystalline semiconductor region can be respectively accomplished by a suitable dielectric oxide glass and a suitable diamagnetic boride glass in a manner void of rectification effects and generally independent of the semiconductor conductivity, other than transient considerations.

Finally, it can be appreciated that the embodiments of this invention provide the ideal means of terminating active circuit elements within monocrystalline semiconductor regions by way of the judicious integration of the three types of passive circuit elements. Resistors are formed by any type of material obeying Ohm's law, including metals, with the property that there always prevails a direct correspondence between current and voltage in a time-independent manner. As a result, ohmic electrodes provide the material means of biasing active circuit elements at the desired current-voltage conditions. However, an ohmic electrode generally forms an undesirable rectifying junction with a monocrystalline semiconductor. All such ohmic electrodes must be isolated from all active circuit regions in some manner.

Consequently, ohmic electrodes are ideally in indirect contact with active circuit elements within monocrystalline semiconductor regions by means of either an intervening dielectric glass, such as silicon dioxide, or an intervening diamagnetic glass, such as silicon diboride. A dielectric oxide glass intervening between an ohmic electrode and a monocrystalline semiconductor region forms a parallel-plate capacitor. Thus, for a sufficiently thick dielectric, e.g. a one micron thick film of silicon dioxide, then a low capacitance essentially isolates an ohmic electrode from a monocrystalline semiconductor at low frequency operation. However, such a low-capacitance dielectric oxide glass can be selectively patterned to expose the electrical contact areas to the active circuit elements within a monocrystalline semiconductor region, as portrayed in FIGURE.

A diamagnetic boride glass, such as silicon diboride, can be uniformly deposited over an oxide-terminated monocrystalline semiconductor region, much in the manner portrayed in FIGURE. A diamagnetic boride glass intervening between an ohmic electrode and a monocrystalline semiconductor forms a parallel-plate inductor. For a sufficiently thick diamagnetic glass, e.g. a one micron thick film of silicon diboride, then a low inductance essentially forms an ohmic contact between the ohmic electrode and the monocrystalline semiconductor at low frequency operation. Since the direct-current resistance of the diamagnetic glass is negligible and since the resistance of a metal electrode is much lower than that of a semiconductor, then the inductively-impressed current flow into a monocrystalline semiconductor region under steady-state conditions is strictly established by the resistance of the semiconductor region, without generally perturbing the semiconductor Fermi level.

The uniaxial electromagnetic displacement in such an inductive glass precludes the need to selectively pattern the diamagnetic boride glass; all ohmic semiconductor contacts necessarily prevail in the oxide via's exposing the semiconductor surface. In this manner, the diamagnetic boride glass passivates the monocrystalline semiconductor and protects said surface from any alloying effects with a metal. If desired, the diamagnetic boride glass can indeed be selectively patterned. Although a diamagnetic boride glass is not readily etched by means of hydrofluoric acid, which indeed etches a dielectric oxide glass, a diamagnetic boride glass can be plasma etched.

By utilizing a suitable intervening diamagnetic glass, an ohmic contact can be formed with virtually any monocrystalline semiconductor region, by a metal or other ohmic electrode, in a manner generally independent of the ionicity or the impurity doping concentration of the semiconductor region. As a result, an ohmic contact can be formed between a metal and any compound semiconductor, such as the zinc and cadmium chalcogenides, without the need for amphoteric impurity doping. Furthermore, an ohmic contact can be formed to a monocrystalline semiconductor region in a manner inherently void of any contact rectification effects such that the impurity doping concentration of the semiconductor can be suitably established by the needs of the active circuit elements formed therein. Finally, a diamagnetic boride glass provides an ohmic contact void of any deleterious alloying of a metal/-semiconductor interface.

The utility of the present invention can best be appreciated in optical devices. Despite the dramatic impact of solid-state technology upon electronic devices in general, nonetheless, optical devices generally yet remain enslaved to the vacuum-state technology developed late in the nineteenth century. Artificial visible light is most often generated by incandescent and fluorescent electric lamps while color display monitors most often utilize cathode-ray-tubes (CRT's). The incandescent electric lamp, invented by Thomas Edison, and the cathode-ray-tube, invented by William Crookes, are interrelated vacuum-state optical devices that are inherently inefficient. However, despite said inefficiency, Edison's lamp and Crookes' CRT have never been yet replaced by a more efficient solid-state optoelectronic device.

The incandescent electric lamp is inefficient for three reasons. First of all, the spectral radiancy of the emitted light is much broader than the sensitivity of the human eye such that a great deal of the emitted radiation is wasted in that it is incapable of stimulating the human eye. Secondly, the broad dispersion in light frequency precludes an incandescent lamp from emitting monochromatic light of a desired color. Thirdly, incandescence is always accompanied by the thermionic emission of electrons so as to result in a degradation of the energy transformation of electricity into light. Beyond such energy considerations, an incandescent lamp is not at all suitable for the monolithic integration with sundry electronic devices.

The vacuum-state fluorescent lamp improves upon the optoelectric energy transformation of the incandescent lamp by exciting solid-state phosphors in a process known as photoluminescence. Basically, high-energy photons, generally in the ultra-violet region, are generated by the electrical ionization of a gas in a glass-encased vacuum, with said glass coated with a suitable phosphor. Basically, a phosphor is a polycrystalline direct-bandgap semiconductor that generates excess electron-hole pairs when impacted by high-energy photons. Such a semiconductor material exhibits an efficient radiative recombination of excess electron-hole pairs so as to emit a highly monochromatic light of a desired wavelength.

In this manner, a fluorescent lamp is capable of emitting white light of a more desired color by controlling the bandgap energy and the midband traps of the phosphor. However, fluorescent lamps are themselves inefficient due to the means by which the gases are ionized to produce the ultraviolet photons and the means by which excess electron-hole pairs are generated in polycrystalline semiconductors. A cathode-ray-tube also emits light by means of the radiative recombination of excess electron-hole pairs in a polycrystalline direct-bandgap semiconductor, i.e. a phosphor, that coats a glass enclosure of a vacuum. However, the phosphors of a cathode-ray-tube are excited by high-energy electrons in a process known as cathodoluminescence.

Electrons are emitted into the vacuum by thermionic emission from an incandescent electrode termed a cathode. Since electrons are negatively charged, then they can be accelerated by a positive anode potential so as to strike the phosphors with energies greater than the bandgap energy required to generate excess electron-hole pairs. Moreover, the beam of charged electrons can be focused and deflected in a controlled manner by electric and magnetic fields. As a result, the impact of the beam upon the phosphorcoated glass face can be accurately controlled in response to some electronic video signal. Furthermore, different phosphors can be suitably arranged to produce the primary colors of visible light at each pixel.

In summary, light emitted from a vacuum-state incandescent body exhibits an undesirably wide spectral radiancy and an undesirable optoelectric energy transformation efficiency. Light emitted from a solid-state luminescent body exhibits a very narrow spectral radiancy of highly monochromatic photons. All semiconductors suitable for the efficient radiative recombination of excess electron-hole pairs, so as to generate photons of a visible-light wavelength, are direct-bandgap compound semiconductors with a large bandgap energy, such as the zinc and cadmium chalcogenides. It is the large ionicity of such materials, unfortunately, that endows them with the ability to generate monochromatic photons in the visible-light spectrum by means of the radiative recombination of excess electron-hole pairs.

While on the one hand, the ionicity of direct-bandgap compound semiconductors provides for the generation of visible-light photons by means of the radiative recombination of excess electron-hole pairs, on the other hand, such an ionicity precludes the ability form a p-n junction void of contact rectification effects. Although direct-bandgap compound semiconductors inherently provide for an efficient radiative recombination of excess electron-hole pairs, such materials do not provide for an efficient means to electrically generate electron-hole pairs.

It is for this reason that many optical devices are relegated to a vacuum-state technology wherein excess electron-hole pairs are generated by the impact of high-energy photons or electrons. This invention provides the means to form an ohmic contact to any monocrystalline semiconductor void of contact rectification effects in a manner independent of the semiconductor conductivity. The ability to amphoterically dope compound semiconductors is thus not required. An isotype rectifying junction can be formed so as to generate excess electron-hole pairs by means of strictly the donor doping or strictly the acceptor doping of a monocrystalline region. Alternatively, both contrary types of impurity doping can be employed to form an anisotype rectifying junction, albeit with one or both such doping concentrations well below the level required to suppress contact rectification.

By means of ohmic contacts formed by metals inductively coupled to direct-bandgap compound semiconductors by a diamagnetic boride glass, then a rectifying junction can be formed so as to generate photons throughout the visible-light spectrum via solid-state injection electroluminescence. Moreover, the photon wavelengths can be varied by varying the rectification junction barrier height via the impurity concentration without deleterious contact rectification effects. In this manner, a more efficient solid-state technology can provide a superior means of generating visible light, both white light and colored light, so as to replace archaic vacuum-state optical devices such as Edison's incandescent lamp and Crookes' cathode-ray-tube.

I claim:

1. A method for forming a semiconductor contact system that provides electrical contact to a semiconductor region by means of an ohmic electrode inductively coupled to said semiconductor region by means of an intervening diamagnetic boride glass between the ohmic electrode and the semiconductor region, with the further property that the diamagnetic boride glass materially constrains the electric current to generally along a rectilinear axis normal to the semiconductor surface in the contact area so as to result in a time-dependent electrical impedance increasing with frequency.

2. The method of claim 1 wherein the diamagnetic boride glass is selected from the group consisting of: carbon diboride ($CB_2$), silicon diboride ($SiB_2$), and germanium diboride ($GeB_2$).

3. The method of claim 1 in which the diamagnetic boride glass is formed by carbon diboride, $CB_2$.

4. The method of claim 1 in which the diamagnetic boride glass is formed by silicon diboride, $SiB_2$.

5. The method of claim 1 in which the diamagnetic boride glass is formed by germanium diboride, $GeB_2$.

* * * * *